United States Patent [19]

Kaneko et al.

[11] Patent Number: 4,760,916

[45] Date of Patent: Aug. 2, 1988

[54] WOUND UNIT OF AN ELECTRONIC COMPONENTS SERIES

[75] Inventors: Fumihiko Kaneko; Katsuyuki Moriyasu, both of Nagaokakyo, Japan

[73] Assignee: Murata Manufacturing Co., Ltd., Japan

[21] Appl. No.: 860,097

[22] Filed: May 6, 1986

[30] Foreign Application Priority Data

May 8, 1985 [JP] Japan .................. 60-068575[U]

[51] Int. Cl.⁴ .............................. B65D 73/02
[52] U.S. Cl. ..................... 206/329; 206/328; 206/460; 206/389; 206/390
[58] Field of Search ............... 206/329, 330, 460, 328, 206/412, 389, 390

[56] References Cited

U.S. PATENT DOCUMENTS

| | | | |
|---|---|---|---|
| 3,433,254 | 5/1969 | Sweeney | 206/330 |
| 3,835,992 | 9/1974 | Adam, IV | 206/460 |
| 4,406,367 | 9/1983 | Bouwknest | 206/460 |
| 4,657,137 | 4/1987 | Johnson | 206/460 |

Primary Examiner—Joseph Man-Fu Moy
Attorney, Agent, or Firm—Ostrolenk, Faber, Gerb & Soffen

[57] ABSTRACT

A wound unit of an electronic components series comprises a cylindrical core and a tape-shaped electronic components series wound in layers on its circumferential surface. On the periphery of the core, there is formed a slit. The electronic components series include a carrier tape made of a cardboard or the like on which not only the feeding holes having a certain pitch are formed but also many through holes responding to the shape of electronic components to be contained therein are distributed in a longitudinal direction. In each of these through holes are contained electronic components and on both of the main surfaces of the carrier tape, cover tapes are adhered to seal off the through holes. The tip of the electronic components series is inserted into the slit of the core and the electronic components series is wound in layers on the circumferential surface of the core. Adhesion layers are formed on the upper surface of the side of the carrier tape provided with the feeding holes of the electronic component series, each layer of the electronic components series being bonded to the next layer by the adhesion agent.

9 Claims, 2 Drawing Sheets

WOUND UNIT OF AN ELECTRONIC COMPONENTS SERIES

BACKGROUND OF THE INVENTION

1. Field of the Invention

The present invention relates to a wound unit of an electronic components series. More specifically, the present invention relates to a wound unit of the electronic components series having a carrier tape retaining a lot of chip components, and adhesive means for maintaining the wound unit rolled up on its core without the use of a flange or the like on the core.

2. Description of the Prior Art

Chip type electronic components are usually mounted on a printed circuit board by utilizing an automatic mounting machine. As a means for supplying such chip components to the machine, a wound unit (roll) of the electronic components series is used. The electronic components series is normally wound and kept on a reel as disclosed, for example, in the Japanese Patent Laying-open No. 150820/1981 laid open on Nov. 21, 1981.

In an automatic mounting machine, a plurality of wound units wound on reels are held in juxtaposition and used. Accordingly, an automatic mounting machine using conventional wound units tends to increase in size due to the width of the wound units. The width of the carrier tape itself, however, is standardized and cannot be made narrower beyond a certain limit.

It would be desirable, therefore, to eliminate all flanges which usually have a large bearing upon the total width of the wound unit. However, with all flanges having been done away with, the wound electronic components series may easily get out of shape due to impacts that may be encountered during transit.

SUMMARY OF THE INVENTION

A principal object of the present invention is, therefore, to provide a narrowest possible width as a whole and still retain shape to a wound unit of an electronic components series.

Briefly speaking, the present invention is a wound unit of the electronic components series formed with adhesive layers between each layer of the electronic components series wound on the core in layers.

The electronic components series in each layer are bonded together by the adhesive layers formed between the coiled layers, thereby enabling the wound electronic components series to retain its shape in the axial and circumferential directions.

According to the present invention, since the flanges are eliminated, the wound unit of the electronic components series having the total width or thickness smaller than the conventional reel type may be obtained. Thus, the automatic mounting machine utilizing such wound unit may be made smaller also. Moreover, since the reels account for a large part of the material and processing costs, these costs may not only be cut down substantially, but also the problems related to recovering such reels can be avoided.

These objects and other objects, features, aspects and advantages of the present invention will become more apparent from the following detailed description of the disclosed embodiments when taken in connection with the accompanying drawings.

BRIEF DESCRIPTION OF THE DRAWINGS

FIGS. 4A and 4B are schematic views showing another embodiment of the present invention, in which FIG. 4A is its cross-sectional view, while FIG. 4B is an enlarged partial plan view of an electronic component series.

DESCRIPTION OF THE PREFERRED EMBODIMENTS

Figure 1:
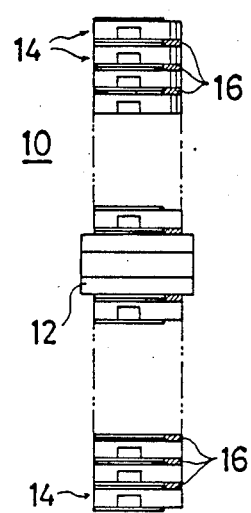
FIG. 1 is a cross-sectional schematic view illustrating one embodiment of the present invention.

FIG. 1 is a cross-sectional schematic view showing one example of an embodiment of the present invention, in which a wound unit 10 of an electronic components series comprises a tape-shaped electronic components series 14 wound in layers on a circumferential surface of a cylindrical or columnar core 12. Each layer of the electronic components series 14 is stuck or bonded or adhered by an adhesion agent 16 as an adhesion means.

Figure 2:
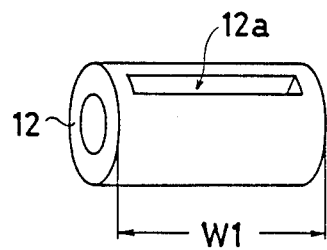
FIG. 2 is a perspective view showing one example of a core.

The core 12 comprises, as illustrated in FIG. 2, a cylindrical member formed, for example, of a resin or the like, the width W1 of which being selected the same as or slightly larger than the width W2 (FIG. 3) of the tape-shaped electronic components series 14 wound thereon, preferably. On the periphery of the core 12, there is formed a slit 12a, in which a tip of the electronic components series 14 is inserted to secure the initial winding.

Figure 3:
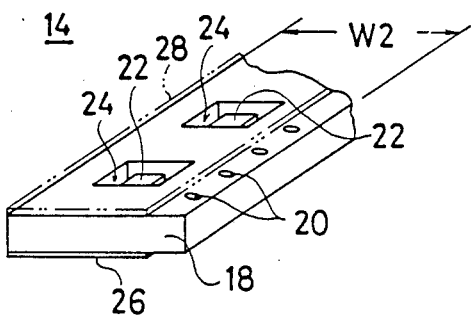
FIG. 3 is a perspective view showing one example of an electronic components series.

The electronic component series 14 includes a carrier tape 18 having the predetermined width W2 and made, for example, of cardboard or the like as shown in FIG. 3. On one side of the carrier tape 18, feeding holes 20, 20 . . . are formed at regular intervals. On the carrier tape 18, a number of through holes corresponding to the size or shape of the chip components 22 to be contained therein are distributed in a longitudinal direction of the carrier tape 18 and serve as cavities 24. More specifically, on one surface of the carrier tape 18, a cover tape 26 is adhered to cover one side of the through holes, which form the cavities 24, 24, . . . Then, a chip component 22 is stored in each cavity 24, and then, on the other surface of the carrier tape 18 a cover tape 28 is adhered to cover the other side of the through holes. These cover tapes 26 and 28 consisting of a synthetic resin film are adhered to the carrier tape 18 through thermal deposition at both sides thereof.

The tip of the electronic components series 12 as shown in FIG. 3 is inserted into a slit 12a of the core 12 as shown in FIG. 2, and wound on the periphery of the core 12 in layers as illustrated in FIG. 1. At this time, the electronic components series 14 is wound, and the adhesion agent 16 is coated on the upper surface, on the side of the upper surface that is provided with the feeding holes 20 of the carrier tape 18 of the electronic components series 14. Then each layer of the electronic components series 14 being laminated is bonded together by the adhesion agent 16 as shown in FIG. 1. Thus, the movement in the axial and circumferential directions of the electronic components series 14 of the wound unit 10 may be prevented and its shape can be retained.

In the embodiment of FIG. 1, the adhesion agent 16 was coated on the side of the carrier tape 18 provided with the feeding holes 20 (FIG. 3). However, it will be appreciated that such adhesion agent 16 may also be coated on the cover tape 28, but it is undesirable to be spread over the cover tape 28 and carrier tape 18. This is because the uneven peeling force may occur when peeling the cover tape 28 off, for example, by the automatic mounting machine.

Figure 4A:
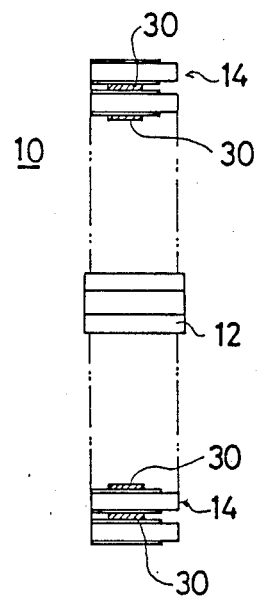
Figure 4B:
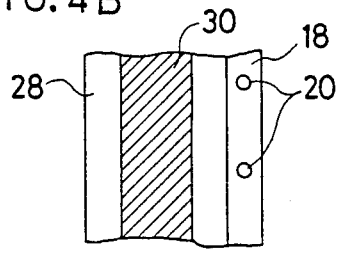

FIGS. 4A and 4B are schematic views showing another embodiment of the present invention, in which FIG. 4A shows its cross-sectional view and FIG. 4B is an enlarged partial plan view. In the embodiment, the wound unit 10 of the electronic components series includes an adhesion tape 30 on the each main surface of which an adhesion layer or agent is formed or applied (referred to "double face adhesive tape" hereinafter), as an adhesion means interposed between each layer of the electronic components series 14 wound on the core. That is, in this embodiment, the electronic components series 14 is wound on the periphery of the core 12 successively, as the double face adhesion tape 30 stuck continuously and longitudinally on the cover tape 28 of the electronic components series 14 as shown in FIG. 4B. Then the cover tape 28 of the upper layer of the electronic components series 14 is stuck or bonded together with the cover tape 26 of the adjacent lower layer by means of the double face adhesion tape 30 as shown in FIG. 4A.

In the embodiment of FIGS. 4A and 4B, the double face adhesion tape 30 may also be stuck on the location that is applied with the adhesion agent 16 in the embodiment of FIG. 1. In this case, the double face adhesion tape may be punched, for example, by a punch or another method, so as not to close the feeding holes.

In all embodiments, electronic components series using a carrier tape such as cardboard were described. However, the present invention may be also applied to an electronic components series using an embossed type of carrier tape.

Figure 5:
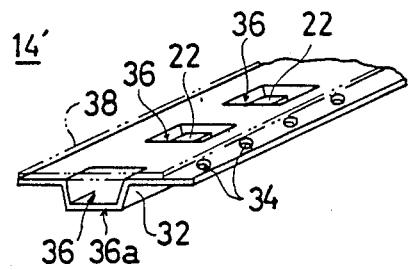
FIG. 5 is a perspective view showing another example of an electronic components series to which the present invention is applied.

FIG. 5 is a perspective view showing an electronic components series utilized in another embodiment of the present invention. The electronic component series 14' includes a carrier tape 32 which is a resin tape. On the side end of the carrier tape 32, feeding holes 34, 34, ... are formed, and a plurality of cavities 36, 36, ... for containing the chip components 22 are further formed thereupon. On the upper surface of the carrier tape 32, a cover tape 38 is adhered to seal up the chip components 22 contained in the respective cavities 36.

Figure 6:
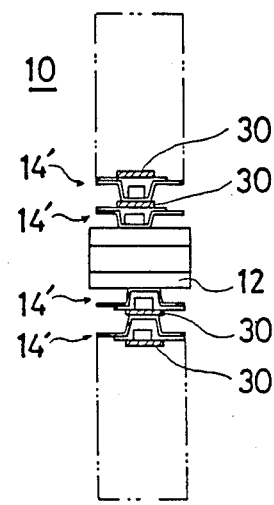
FIG. 6 is a cross-sectional schematic view showing another embodiment of the present invention using electronic components series of FIG. 5.

When such electronic components series 14' is wound as shown in FIG. 6, the cover tape 38 of the electronic components series 14' is bonded together with the bottom face 36a (FIG. 5) of the cavity 36 of the adjacent electronic components series by means of the double face adhesion tape 30 interposed therebetween.

Also, in the embodiment of FIG. 6, the adhesion agent 16 as illustrated in FIG. 1 may be substituted for the double face adhesion tape 30.

Figure 7:
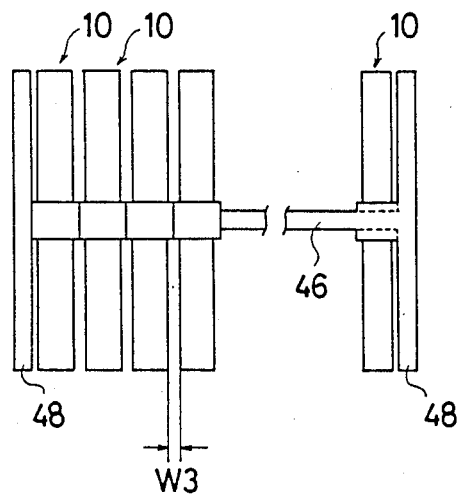
FIG. 7 is a schematic view showing a state where a multiple number of wound units are retained in juxtaposition.

FIG. 7 is a schematic view showing one example of the retained construction of a plurality of wound units.

The wound units 10 formed in accordance with any embodiment previously described, are retained during transit as shown in FIG. 7. More specifically, a plurality of wound units 10 are supported between two flanges 48 connected with an axis 46, whereupon the flanges 48 serve, for example, as a reinforcing member during transit.

As it will be apparent from FIG. 7, if the wound unit 10 in accordance with the present invention is utilized, its width may be reduced substantially. In particular, the invention has advantages with respect to the space factor of the automatic mounting machine and so on, as compared with the conventional electronic components series rolled on a reel with flanges.

When a number of wound units 10 are retained as shown in FIG. 7, a space W3 between the width W1 of the core 12 and the width W2 of the electronic components series 14 or 14', serve effectively as the clearance between the adjacent wound units 10 of the electronic components series.

However, any suitable spacer (not shown) may be inserted into such clearance for the purpose of reinforcement, for example, during transit.

It is to be understood that the example herein shown and described is to be taken merely as an example, and that any selections, changes and variations in the location, shape and kind of the adhesive layer may be made if necessary.

In the case where the adhesion means, i.e. the adhesion agent 16 or the double face adhesion tape 30 is formed on the cover tapes 26 and 28 as shown in FIGS. 4A, 4B and 6, it is necessary to make an adhesion force of the adhesion means weaker than an adhesion force of the cover tapes 26 and 28 for ensuring the cover tapes 26 and 28 cannot be peeled off when the wound unit 10 is unrolled.

Although the present invention has been described and illustrated in detail, it is clearly understood that the same is by way of illustration and example only and is not to be taken by way of limitation, the spirit and scope of the present invention being limited only by terms of the appended claims.

What is claimed is:

1. A wound unit comprising an electronic components series wound on a core, which maintains its shape without being retained on the core by retaining means such as a reel flange, said wound unit comprising:
   a flangeless core,
   a tape-shaped electronic components series wound on the periphery of said core and retaining a plurality of chip components, and
   a substantially continuous adhesive strip formed on said electronic components series for adhering successive layers of said electronic components series to one another as wound on said core, whereby said wound unit maintains its shape while being free of flanges on its core.

2. A wound unit in accordance with claim 1, wherein said electronic components series includes a carrier tape formed with cavities distributed in its longitudinal direction for containing the electronic components therein.

3. A wound unit in accordance with claim 2, wherein said carrier tape includes a flat tape.

4. A wound unit in accordance with claim 2, wherein said carrier tape includes an embossed tape in which said cavities are formed projectingly.

5. A wound unit in accordance with claim 2, which further comprises a cover tape for sealing up said cavities, said cover tape covering only part of the lateral width of a top surface of said carrier tape, and wherein said adhesive strip is formed on a remaining lateral part of said top surface of said carrier tape where said cover tape is not adhered whereby the radial thickness of said electronic components series is not increased by forming said adhesive strip thereon.

6. A wound unit in accordance with claim 5, wherein said adhesion means includes an adhesion agent.

7. A wound unit in accordance with claim 6, wherein said adhesion means includes a double face adhesion tape.

8. A wound unit in accordance with claim 2, which further comprises a cover tape for sealing up said cavities, and wherein said adhesive strip is formed on said cover tape, wherein an adhesion force which is required to remove said adhesive strip from said cover tape is selected to be weaker than an adhesion force which is required to remove said cover tape from said carrier tape.

9. A wound unit in accordance with claim 2, wherein the width of said core is selected as same the or slightly larger than that of said carrier tape.

* * * * *